United States Patent
Lee et al.

(10) Patent No.: US 7,250,671 B2
(45) Date of Patent: Jul. 31, 2007

(54) LEAD FRAME AND METHOD FOR MANUFACTURING SEMICONDUCTOR PACKAGE WITH THE SAME

(75) Inventors: Sang-hun Lee, Changwon-si (KR); Sung-kwan Paek, Changwon-si (KR); Se-chuel Park, Changwon-si (KR)

(73) Assignee: Samsung Techwin Co., Ltd. (KR)

( * ) Notice: Subject to any disclaimer, the term of this patent is extended or adjusted under 35 U.S.C. 154(b) by 0 days.

(21) Appl. No.: 11/063,353

(22) Filed: Feb. 23, 2005

(65) Prior Publication Data
US 2005/0184366 A1    Aug. 25, 2005

(30) Foreign Application Priority Data
Feb. 23, 2004   (KR) .................. 10-2004-0011819

(51) Int. Cl.
*H01L 23/495* (2006.01)
(52) U.S. Cl. ........................... 257/669; 438/123
(58) Field of Classification Search ............ 257/692, 257/666, 669
See application file for complete search history.

(56) References Cited

U.S. PATENT DOCUMENTS

| 5,994,767 | A  | * | 11/1999 | Huang et al. ............... 257/666 |
| 6,469,386 | B1 | * | 10/2002 | Lee et al. .................... 257/748 |
| 6,518,508 | B2 |   | 2/2003  | Park et al. .................. 174/255 |
| 2002/0104682 | A1 | * | 8/2002 | Park et al. .................. 174/255 |

* cited by examiner

*Primary Examiner*—William David Coleman
*Assistant Examiner*—Su C. Kim
(74) *Attorney, Agent, or Firm*—Tuchman & Park LLC

(57) ABSTRACT

Provided is a method for manufacturing a lead frame and a semiconductor package having a semiconductor chip for connecting to an outer board and having a base metal layer formed of iron and nickel as main elements. The method includes preparing the base metal layer of a lead frame, forming one or more plating layers on the base metal layer, mounting the semiconductor chip on the lead frame, molding the semiconductor chip and at least a portion of the lead frame, bending the lead frame to form the lead frame in a predetermined shape, and heat-treating the lead frame for forming a diffusion layer in order to protect the lead frame from corrosion.

9 Claims, 10 Drawing Sheets

LEAD FRAME AND METHOD FOR MANUFACTURING SEMICONDUCTOR PACKAGE WITH THE SAME

BACKGROUND OF THE INVENTION

This application claims priority of Korean Patent Application No. 10-2004-0011819, filed on Feb. 23, 2004, in the Korean Intellectual Property Office, the disclosure of which is incorporated herein in its entirety by reference.

1. Field of the Invention

The present invention relates to a lead frame and a method for manufacturing a semiconductor package with the same, and more particularly, to a lead frame for connecting a semiconductor chip to an outer circuit, the lead frame being manufactured with a pre-plated frame. The present invention further relates to a method for fabricating a semiconductor package with such a lead frame.

2. Description of the Related Art

As shown in FIG. 1, a conventional lead frame typically includes a die pad 110 and a plurality of leads 120 arranged around the die pad 110. The die pad 110 is connected to a rail or outer flame 170 by pad supports 180 to support a semiconductor chip on the die pad 110. The leads 120 include inner leads 130 and outer leads 140. A damper portion 160 is disposed between the inner and outer leads 130 and 140 to support them while maintaining a gap between the inner and outer leads 130 and 140. When an assembly of the semiconductor package is completed, the outer flame 170 and the damper portion 160 are cut out.

FIG. 2 shows a semiconductor package 105 containing a lead frame depicted in FIG. 1, in which a semiconductor chip 50 is mounted on the lead frame.

Referring to FIG. 2, the semiconductor chip 50 is mounted on the die pad 110. The inner leads 130 are wire-bonded to the semiconductor chip 50 by a wire 52, and the outer leads 140 are electrically connected to an external circuit (not shown). Accordingly, the leads 120 have a bonding portion W that is wire-bonded to the semiconductor chip 50, an outer bonding portion S connected to the outer circuit and bending portions B bent at an intermediate portion of the leads 120.

The semiconductor chip 50 and the inner leads 130 are molded with resin 55 to form the semiconductor package 105. In manufacturing such a semiconductor package 105, there is a need for improving the wire boning property between the semiconductor chip 50 and the inner leads 130. For this, solder containing Sn—Pb may be deposited on a predetermined area of the outer leads 140. However since this process must be performed through a wet process after the resin molding process is performed, the reliability of the product may be deteriorated.

To solve this problem, a pre-plate frame has been proposed. In this method, metal having a superior solder-wettability is pre-deposited before the semiconductor packaging process so that the solder plating process can be omitted in the post semiconductor packaging process. The lead frame using the pre-plated frame makes the post packaging process simple. In addition, environmental pollution can be prevented since soldering can be omitted in the semiconductor packaging process.

However, since the semiconductor chip bonding, wire boding, epoxy molding, and soldering processes are performed at a temperature generally above 200° C., it becomes important to properly select the outer plating layers when the lead frame is formed with the pre-plated frame.

Describing more specifically, the outer plating layers of the pre-plated lead frame must be good in the oxidation property at a high temperature, in the bonding property for bonding with the bonding wire, in the adhering property for attaching with the chip formed typically of silicon, in the bonding property for bonding with the epoxy resin, and in the deliquescence with the solder for soldering. Furthermore, the outer plating layers must have a proper ductility to prevent the bonding capillary from being worn during the wire bonding process. In addition, the outer plating layers must have a property for preventing the migration phenomenon that may cause the short circuit as the plated metal is diffused to a contact medium for a long time under a high temperature and humidity condition in order to obtain a long term reliability of the semiconductor device.

FIG. 3 illustrates a construction of a lead frame disclosed in U.S. Pat. No. 6,518,508 that is assigned to the co-assignee of this application. This lead frame may be manufactured through a conventional method for forming a pre-plated frame that can satisfy the above-described conditions.

Referring to FIG. 3, the lead frame 120 includes a base metal layer 121 formed of copper, copper alloy or an iron-nickel alloy, a Ni plating layer 122 formed of nickel or nickel alloy and deposited at least on an upper surface of the base metal layer 121, a Pd plating layer 123 formed of palladium or palladium alloy and deposited on the Ni plating layer 122, and a protective plating layer 124 formed of Ag or Ag alloy and deposited on the Pd plating layer 123.

Such lead frames that are formed through the known pre-plating methods have a good effect when the lead frames are not damaged for example by an outer shock or the like. However, since the lead frames must go through a bending process during a conventional semiconductor package assembling process, the plating structure at the bending portion can be cracked and corroded. This problem may be more severe when the base metal layer 121 is formed of alloy 42 rather than cooper or cooper alloy. As well known in the art, alloy 42 is composed of 42% Ni and 58% Fe, and widely used as a base material for the lead frame. However, since the alloy 42 is greatly different in the dielectric characteristics from that of the over layer metals such as Pd, Au and Ag of the Pd plating layer 123 and the protective plating layer 124, a galvanic coupling may be occurred, which may facilitate a severe corrosion of the base metal layer 121.

Particularly, referring to FIG. 4, during the lead frame manufacturing process, cracks or other defects may be easily incurred, thereby causing portions of the protective plating layer 124 to be easily chipped off. When the protective plating layer 124 is chipped off or otherwise damaged, inner layers such as the base metal layer 121 and Ni plating layer 122 can be exposed to oxygen contained in the air. Corrosion can be more easily developed at the exposed portions (such as portion 120c in the figure) due to the galvanic coupling.

Where the Pd plating layer 123 is plated on the Ni plating layer 122 formed on the defective portions through an electroplating process as shown, a large amount of hydrogen is mixed with the educed Pd components because the education potential of Pd is similar to that of the hydrogen, and the Pd plating layer 123 can be damaged more quickly. Accordingly, cracks may be easily developed at wired bonding portions W and soldering portions S of the lead frame 120. In addition, as it is common to form the Ni, Pd and protective plating layers through the electroplating process, the electroplating of the plating layers has a tendency to deteriorate ductility of the lead frame. Accordingly, when the bending portions B are formed in the lead frame, cracks may be easily developed at the bending portions B.

Because the cracks can easily be developed at the bending portions B, the wire-bonding portions W of the lead frame, and the soldering portions S of the external leads, these cracked portions are readily exposed to the air, and the galvanic coupling is increasingly occurred at these portions. As a result, the exposed portions may be easily corroded.

Furthermore, in the course of forming the Pd and Ni plating layers, a large amount of hydrogen is mixed with the lead frame. As a result, the deposition density of the Pd and Ni plating layers is degraded, thereby deteriorating the overall reliability of the lead frame.

SUMMARY OF THE INVENTION

The present invention provides a method for producing a semiconductor package, which can prevent corrosion of the lead frame to be caused, for example, by cracks developed after the lead frame is formed, in particular when the base metal of the lead frame is formed essentially of iron (Fe) and nickel (Ni), such as alloy 42. Also, the present invention provides a lead frame produced for use with such a semiconductor package.

The present invention also provides a method for producing a semiconductor package, which can effectively discharge the harmful hydrogen components produced in the course of forming plating layers on the lead frame.

According to one aspect of the present invention, there is provided a method of providing a semiconductor package, in which the method comprises: providing a base metal layer of a lead frame formed of iron and nickel as main elements; forming one or more plating layers on the base metal layer; mounting a semiconductor chip on the lead frame; molding the semiconductor chip and at least a portion of the lead frame; bending the lead frame to form the lead frame in a predetermined shape; and, heat-treating the lead frame after said bending of the lead frame.

A heat-treating temperature in the heat-treating may be performed at a temperature of about 150° C. to about 350° C. A heat-treating time in the heat-treating may be about 1 minute to about 10 minutes.

The forming of one or more plating layers may include forming a Ni plating layer formed of nickel or nickel alloy on the base metal layer, and forming a Pd plating layer formed of palladium or palladium alloy on the Ni plating layer. The forming of one or more plating layers may further include forming of a protective plating layer of at least one metal or alloy selected from the group consisting of Ag, Au, Co, Ti, and Pd on the Pd plating layer.

The heat-treating of the lead frame may include forming a diffusing layer formed of at least one metal selected from the group consisting of Ag, Au, Co, Ti, and Pd.

According to another aspect of the present, invention, there is provided a semiconductor device which comprises: a lead frame including a base metal layer formed essentially of iron and nickel, at least one plating layer disposed on the base metal layer, and a protective diffusion layer containing metallic components selected from the group consisting of Ag, Au, Co, and Pd, the diffusion layer being disposed on an exposed external surface of the lead frame where the at least one plating layer is disposed by heat treating the at least one plating layer, the lead frame further including a bent portion; a semiconductor chip mounted on the lead frame; and, a molding material encapsulating the semiconductor chip and at least a portion of the lead frame except the bent portion of the lead frame.

The base metal layer of the lead frame is preferably formed of alloy 42. The at least one plating layer preferably includes a Ni plating layer formed of nickel or nickel alloy and deposited on at least one surface of the base metal layer, a Pd plating layer formed of palladium or palladium alloy and deposited on the Ni plating layer, and a protective plating layer formed of at least one metal selected from the group consisting of Ag, Au, Co, Ti, and Pd and disposed on the Pd plating layer.

According to another aspect of the present invention, there is provided a lead frame which comprises: a base metal layer formed of nickel and iron as major elements; a Ni plating layer deposited on at least one surface of the base metal layer, the Ni plating layer being formed of nickel or nickel alloy; a Pd plating layer formed on the Ni plating layer, the Pd plating layer being formed of palladium or palladium alloy; and a diffusion layer deposited on least an exposed portion of the base metal, Ni plating, Pd plating layers for protecting the lead frame from corrosion.

The base metal layer may be formed of alloy 42. The diffusion layer may be obtained by heat treatment of the lead frame after forming the Pd plating layer on the Ni plating layer, According to the present invention, even when there are minute cracks developed during the bending operation of the lead frame, corrosion of the lead frame can effectively be prevented even when the base metal layer is formed of alloy 42.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
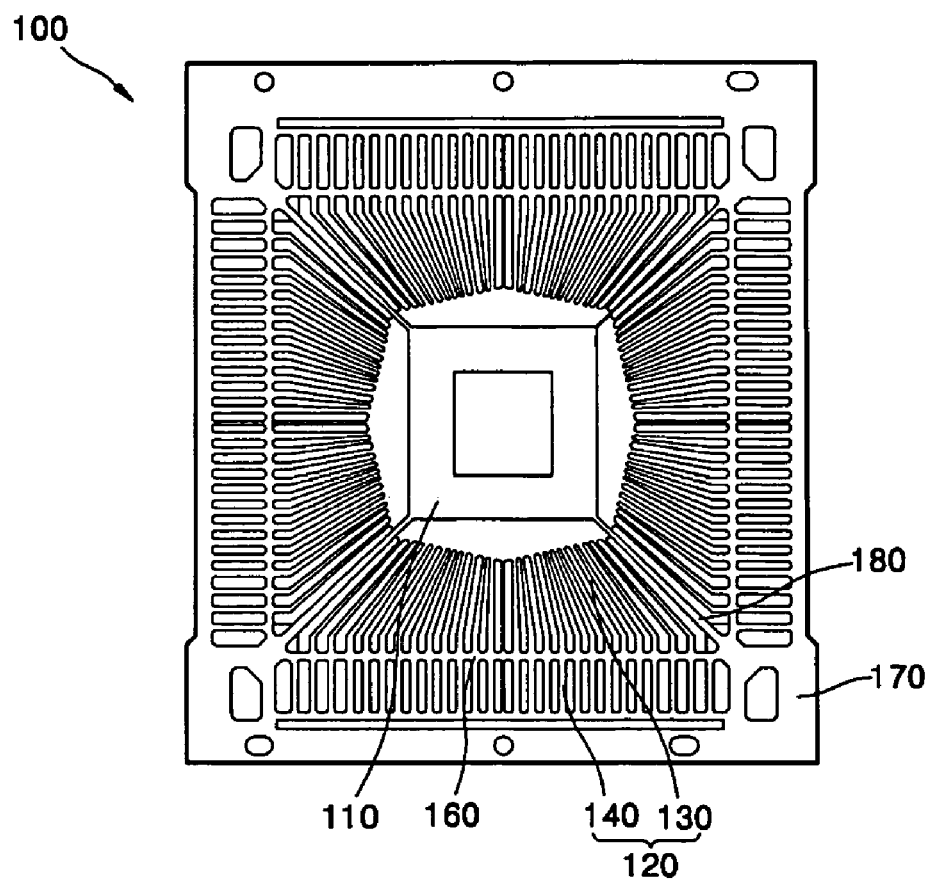
FIG. 1 is a plane view of a conventional lead frame.
Figure 2:
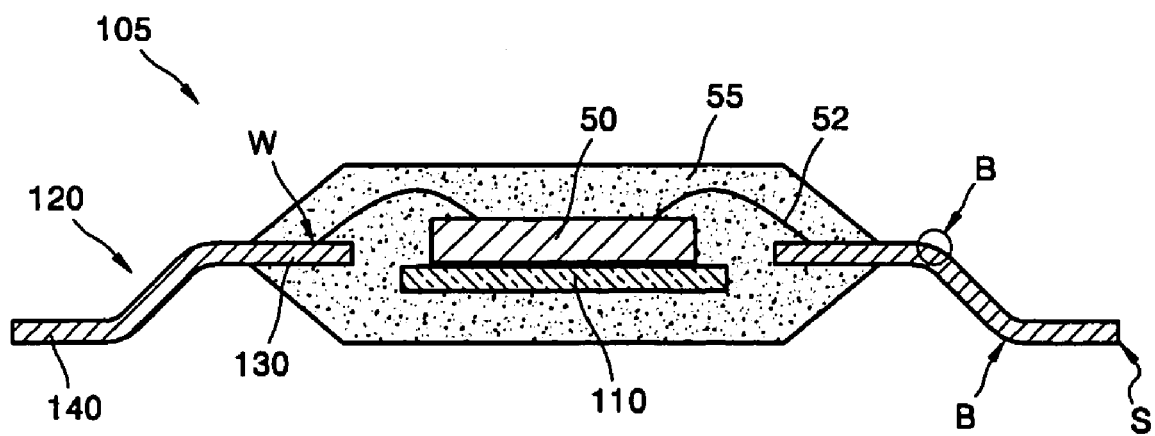
FIG. 2 is a sectional view of a semiconductor package having a semiconductor chip mounted on the lead frame depicted in FIG. 1.
Figure 3:
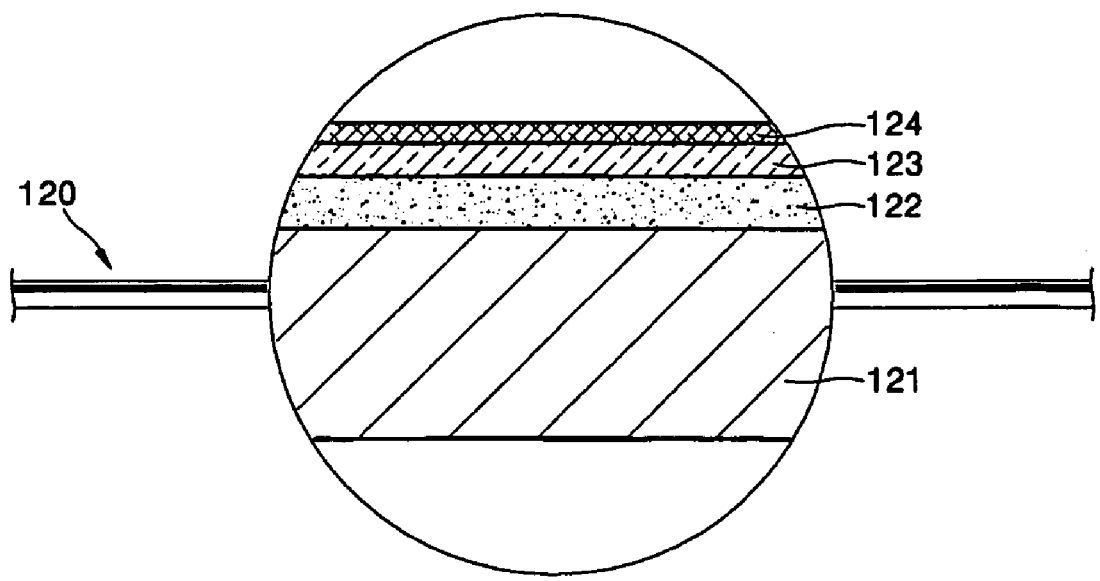
FIG. 3 is a sectional view of a plating structure of a conventional lead frame.
Figure 4:
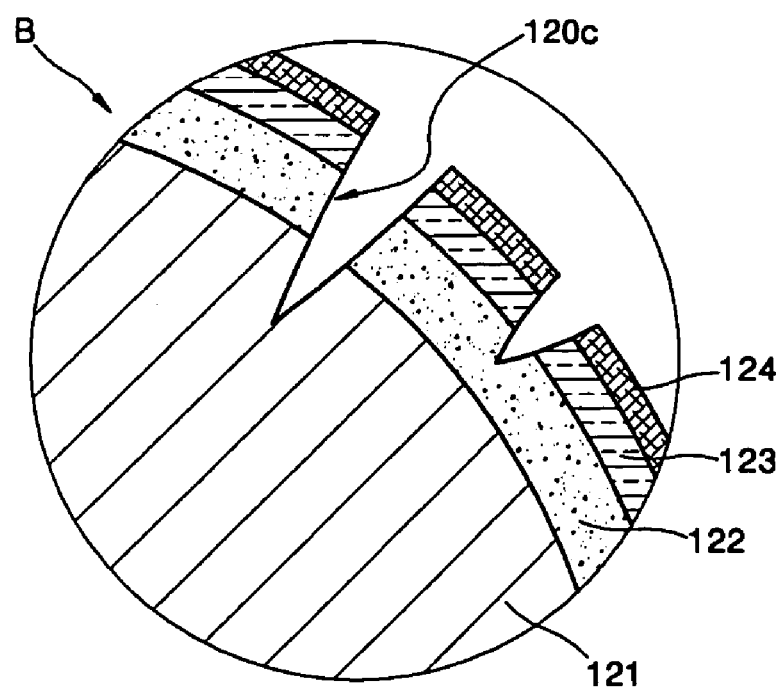
FIG. 4 is an enlarged sectional view at a bending portion of the lead frame of FIG. 3.

The present invention will now be described more in details with reference to the accompanying drawings, in which exemplary embodiments of the invention are shown. The invention may, however, be embodied in many different forms and should not be construed as being limited to the embodiments set forth herein; rather, these embodiments are provided so that this disclosure will convey and explain the concept of the invention to those skilled in the art. In the drawings, the thickness of each layer and region is exaggerated for simplicity and clarity purposes.

The inventive lead frame has a base metal layer formed preferably of iron and nickel as major components. In this case, the base metal layer can be formed of alloy 42 containing 42% Ni, 58% Fe and other minute elements.

Figure 5:
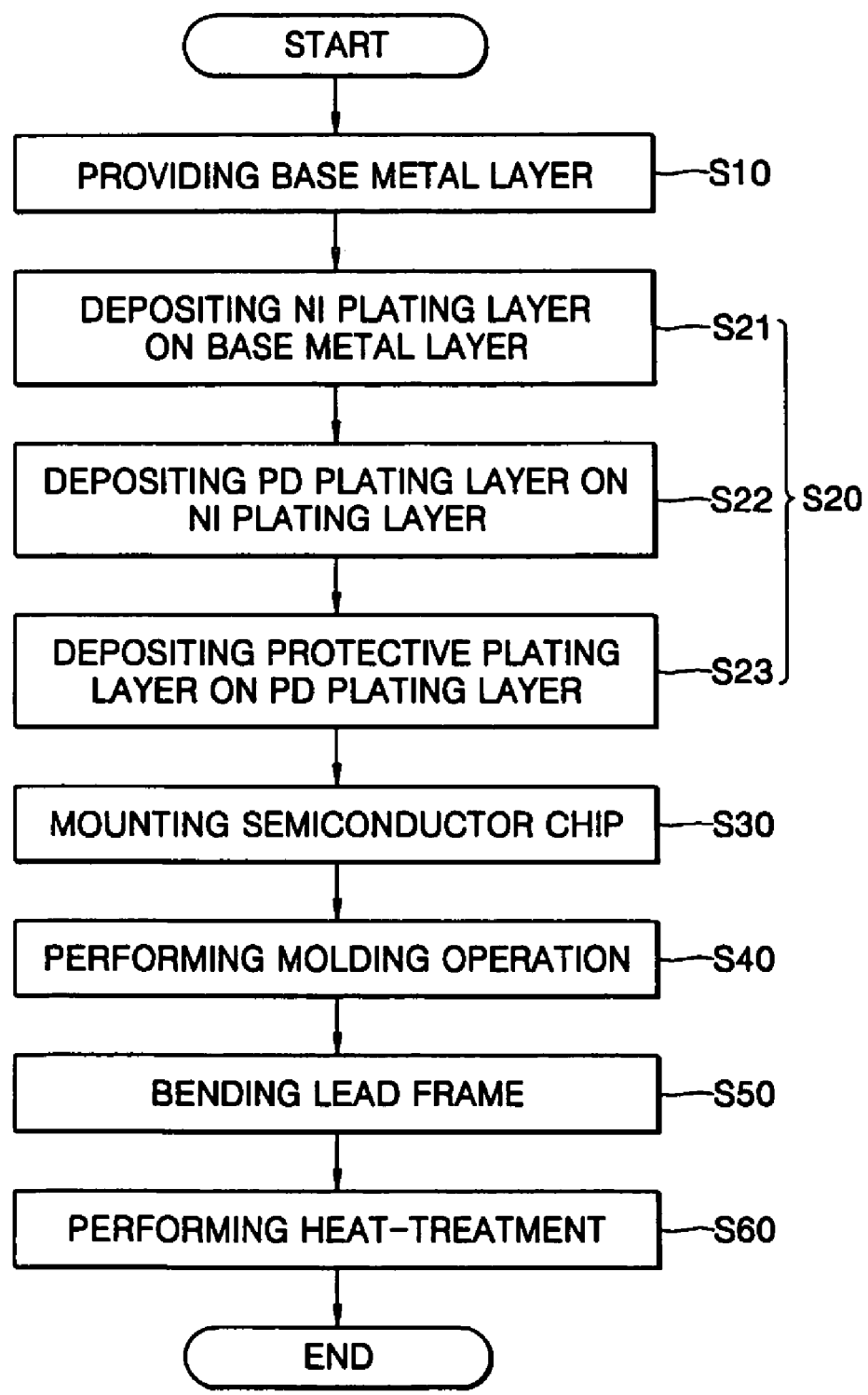
FIG. 5 is a flowchart illustrating a method for manufacturing a semiconductor package according to one embodiment of the present invention.
Figure 6A:
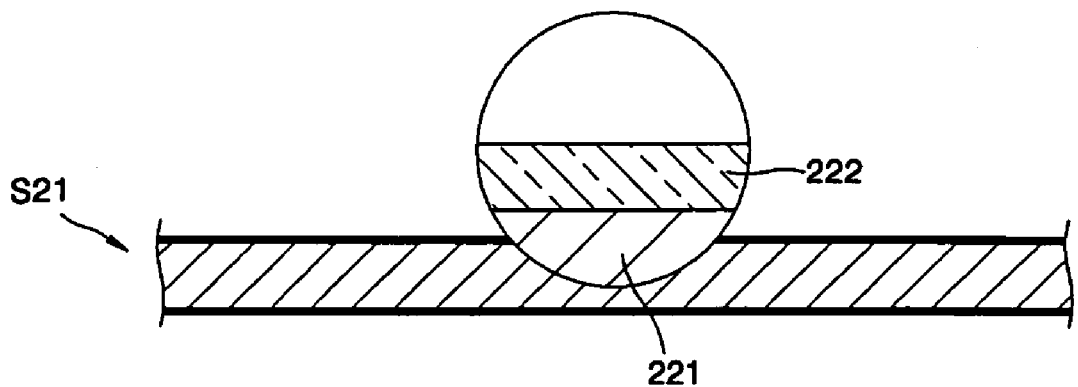
FIGS. 6A through 6G are sectional views illustrating respective operations for manufacturing a semiconductor package according to one embodiment of the present invention.
Figure 6B:
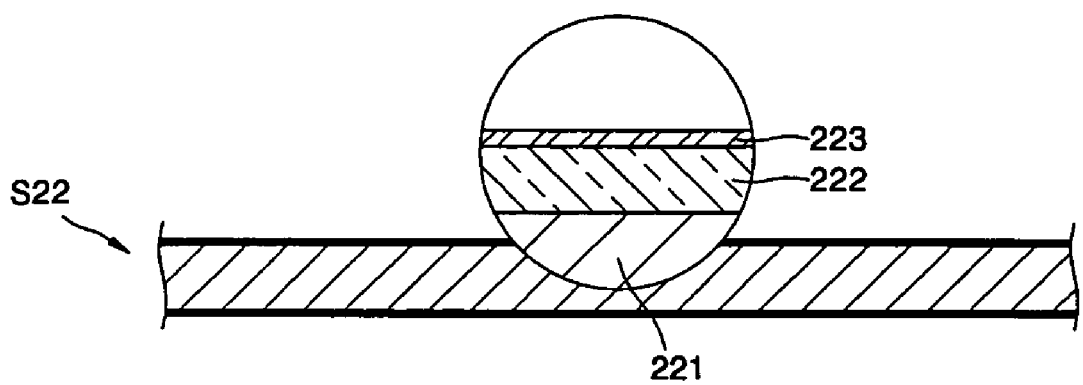
Figure 6C:
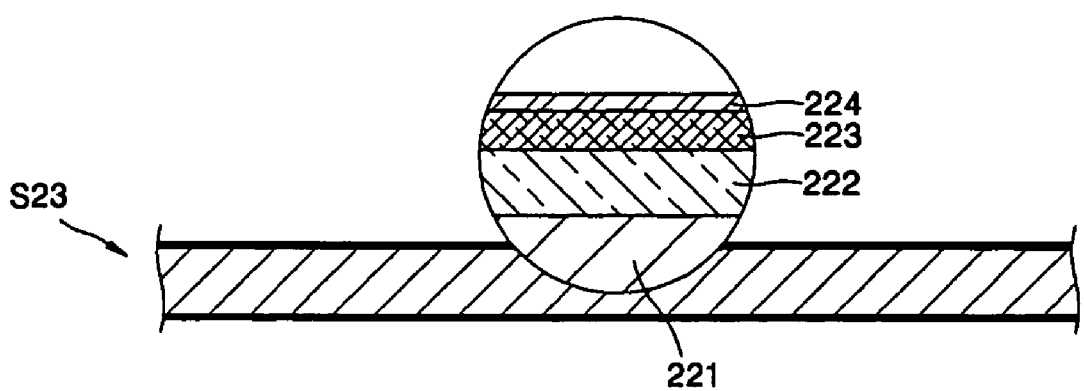
Figure 6D:
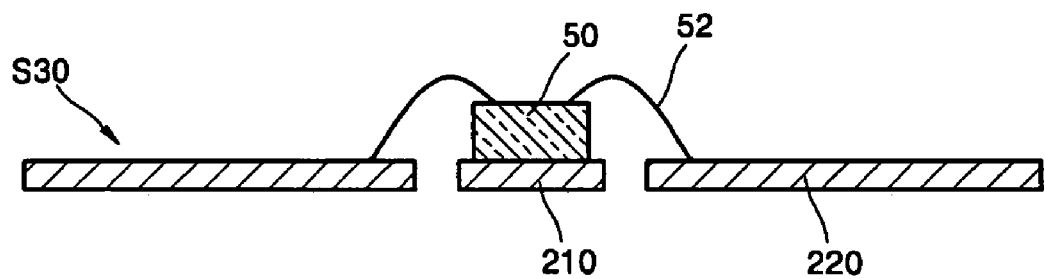
Figure 6E:
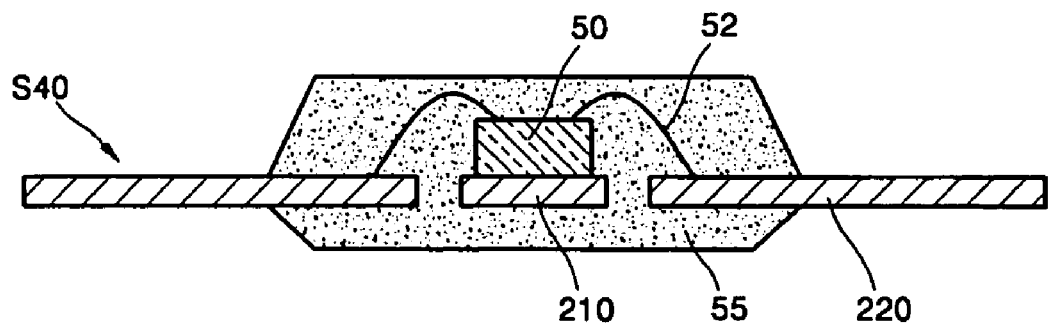
Figure 6F:
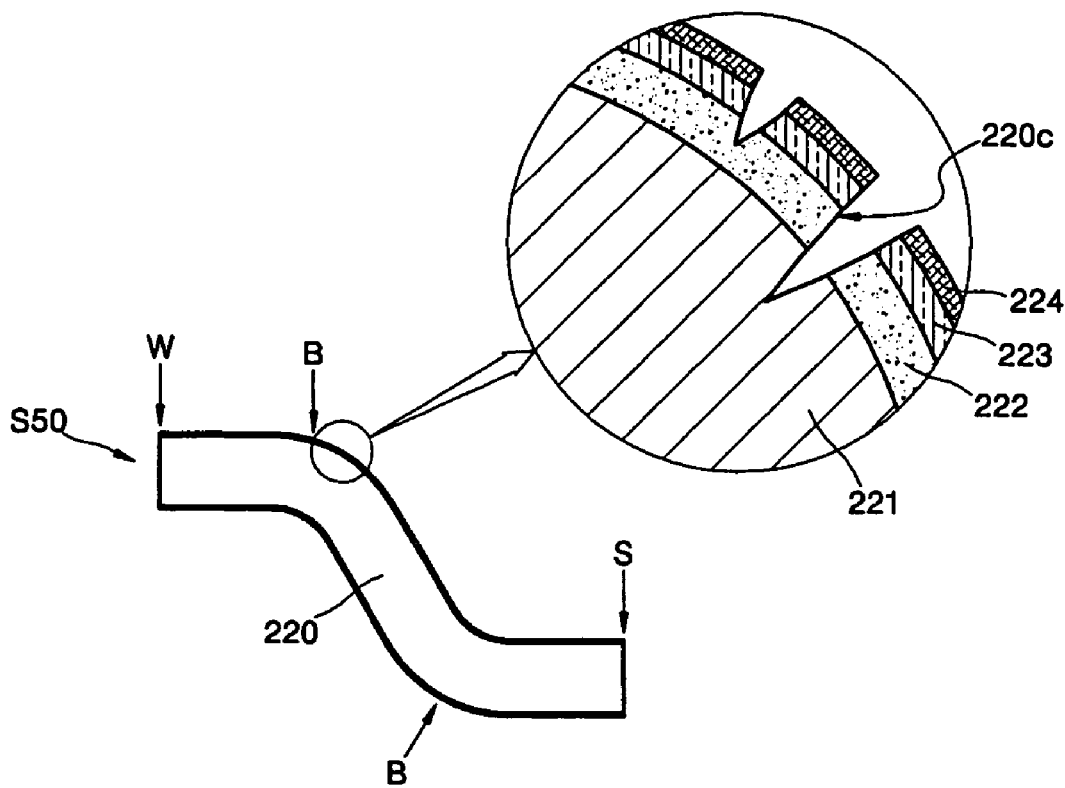
Figure 6G:
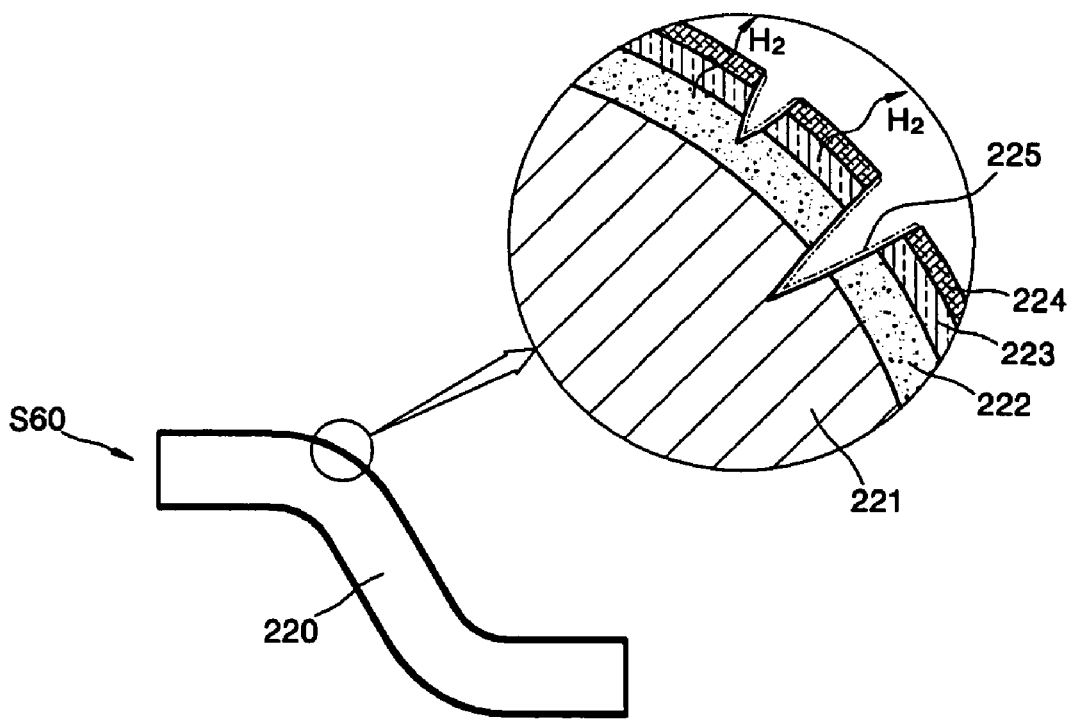

FIG. 5 shows a flowchart illustrating a method for forming a semiconductor package according to one embodiment of the present invention, and FIGS. 6a through 6g show sectional views of respective operations for making a semiconductor package according to one embodiment of the present invention.

As shown in the drawings, the base metal layer 221 is first provided (S10). Then, plating layers are deposited on the base metal layer 221 (S20) before a semiconductor assembling process is preformed.

According to one preferred embodiment as shown, in the step (S20) a Ni plating layer 222 formed of nickel or nickel alloy is first deposited on the base metal layer 221 (S21) and then a Pd plating layer 223 formed of palladium or palladium alloy is deposited on the Ni plating layer 222 (S22). The Ni plating layer 222 functions to prevent the base metal layer 221 from being diffused to the plating surface of the lead frame. The Pd plating layer 223 has a good property in soldering, and also functions to protect the surface of the Ni plating layer 222.

A protective plating layer 224 formed of precious metals having high oxidation-resistance is preferably further deposited over the Pd plating layer 223. Hence, oxidation of the Pd plating layer 223 can effectively be prevented. The protective plating layer 224 can be formed of one or more metals selected from the group consisting of Ag, Au, Co, Ti, and Pd.

The protective plating layer 224 may be formed through a variety of methods. For example, when the protective plating layer 224 is formed of Pd and Au or Au and Ag, the metals may be independently plated through at least one alternate plating process. Alternatively, the metals may be alloyed and plated through electroplating process.

Next, the lead frame is subject to a semiconductor package assembly process. In the semiconductor package assembling process, a semiconductor chip is attached on the lead frame (S30) and then the semiconductor chip and at least a portion of the lead frame are molded to form a semiconductor package (S40).

In the chip assembly operation (S30), the semiconductor chip 50 is first mounted on a die pad 210 and then connected to leads 220 by a connecting member, for example, by a wire 52. In the drawings, the semiconductor chip 50 and the leads 220 are shown to be connected by bonding with a wire 52. However, the present invention is not limited to this. Any other conceivable constructions for electrically connecting the semiconductor chip 50 to the leads 220 may also be applicable.

In the molding step (S40), the semiconductor chip 50 and at least a central portion of the leads 220 are molded by a molding object 55 to protect the semiconductor chip from outer impact or the like.

After molding of the package, external portions of the lead 220s, which are not molded, are bent into a predetermined shape (S50).

In the course of bending the leads 220, the bending portions may be minutely cracked, whereby the base metal layer 221 and/or the Ni plating layer 222 may be exposed to outer air at exposed portions 220c caused by the cracks. Galvanic coupling may be occurred particularly at the exposed areas between the Ni plating layer 222 and Pd plating layer 223 or the protective plating layer 224, or between the alloy 42 layer 221 and the Pd plating layer 223 or the protective plating layer 224, thereby expediting the corrosion process.

Therefore, in the present invention, the lead frame is heat-treated (S60) after the leads 220 are bent (S50) in order to prevent corrosion at the exposed portions 220c.

In the heat-treatment step (S60), a preferable heat-treating temperature may be set at 150-350° C. When the heat-treating temperature is lower than 150° C., the heat treating effect cannot be sufficiently obtained. When the heat-treating temperature is higher than 150° C., a surface of the lead frame may be oxidized, deteriorating a soldering quality.

The heat treating may be performed for 1-10 minutes. When the heat treating is performed for less than 1 minute, the sufficient heat treating effect cannot be obtained. When the heat treating is performed for more than 10 minutes, the soldering quality is deteriorated. These conditions are selected considering certain factors and also in a manner to set a minimum time to apply a sufficient active energy required to diffuse the metal components of the layers but not to damage the semiconductor package in the course of transmitting the heat energy. The active energy for diffusing the metal may be supplied according to a variety of different methods known in the art.

By the heat-treatment, a diffusion layer 225 formed of at least one metal selected from the group consisting of Ag, Au, Co, Ti, and Pd is deposited on the outer surface of the lead frame, particularly, on the exposed portions 220c at which the base metal layer, Pd plating layer, and Ni plating layer are exposed to the outer air.

Describing more in details, the exposed portions 220 of the lead frame become a good path through which metallic atoms can be diffused. Thus, by the heat treating step (S60), the metallic atoms of the outer plating layers, particularly of the protective plating layer 224 formed of Ag, Au, Co, Ti, or Pd, are diffused to the external side and the exposed portions 220. In this manner, the diffusing layer 225 containing at least one element of Ag, Au, Co, Ti, and Pd is deposited on the exposed portions 220c, in particular.

The diffusing layer 225 functions as another protective plating layer to prevent the alloy 42 or Ni exposed through the exposing portion 220c from directly contacting the outer air. As a result, oxidation of the alloy 42 and Ni and corrosion of the lead frame can effectively be prevented.

Meanwhile, during the formation of the Pd plating layer 223 and the Ni plating layer 222, hydrogen is readily mixed into the lead frame, thereby deteriorating density of the plating layers and the lead frame and making the plating layers unstable.

However, according to the present invention, as the heat treating operation is performed, the hydrogen components in the lead frame are activated by the high temperature of heat treatment. As a result, the hydrogen atoms react one another to be diffused to the surface and are easily discharged to the external environment, thereby improving the corrosion-resistance property of the plating layers and also increasing density, ductility and reliability of the lead frame.

The effect and utilities of the present invention can be more clearly understood by the following test examples.

TEST EXAMPLES

As a test sample, a semiconductor package with a lead frame having a base metal layer of alloy 42, a Ni plating layer, a Pd plating layer, a protective plating layer formed of Au and Ag, plated in this order, was used.

The corrosion-resistance property was tested through a salt water spraying test. 55% sodium chloride was sprayed by 40 g/m$^2$ per 24 hours in a state where the temperature of the chamber was 35° C. In this case, the lead frame had been subjected to a reflow operation performed in a reflow soldering device having a maximum reflow temperature of 235° C. and a reflow time 7m/minute.

Figure 7A:
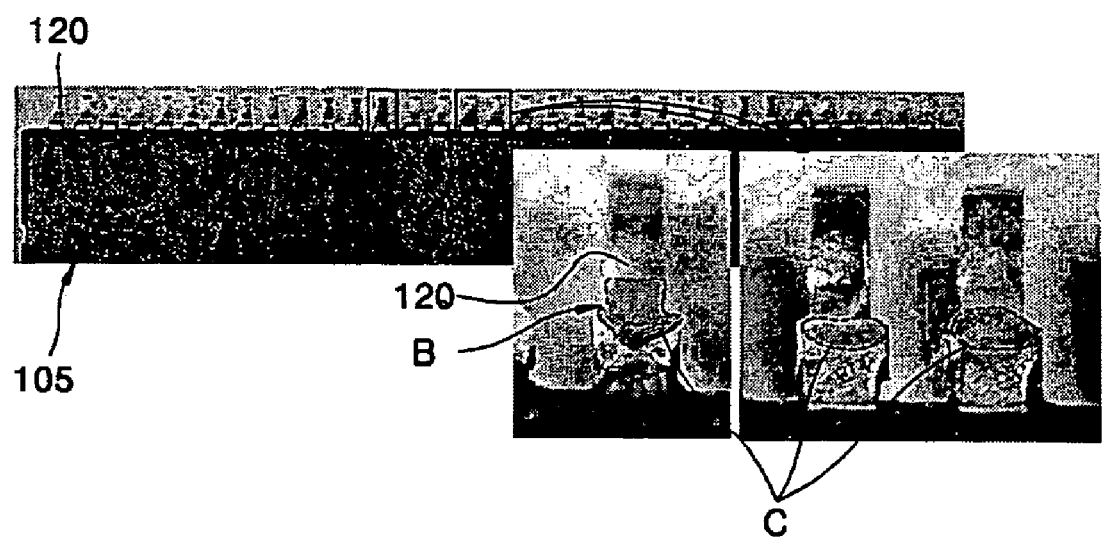
FIG. 7A is a photographic view of a lead frame that is manufactured according to a conventional method and gone through a salt water spraying test.
Figure 8A:
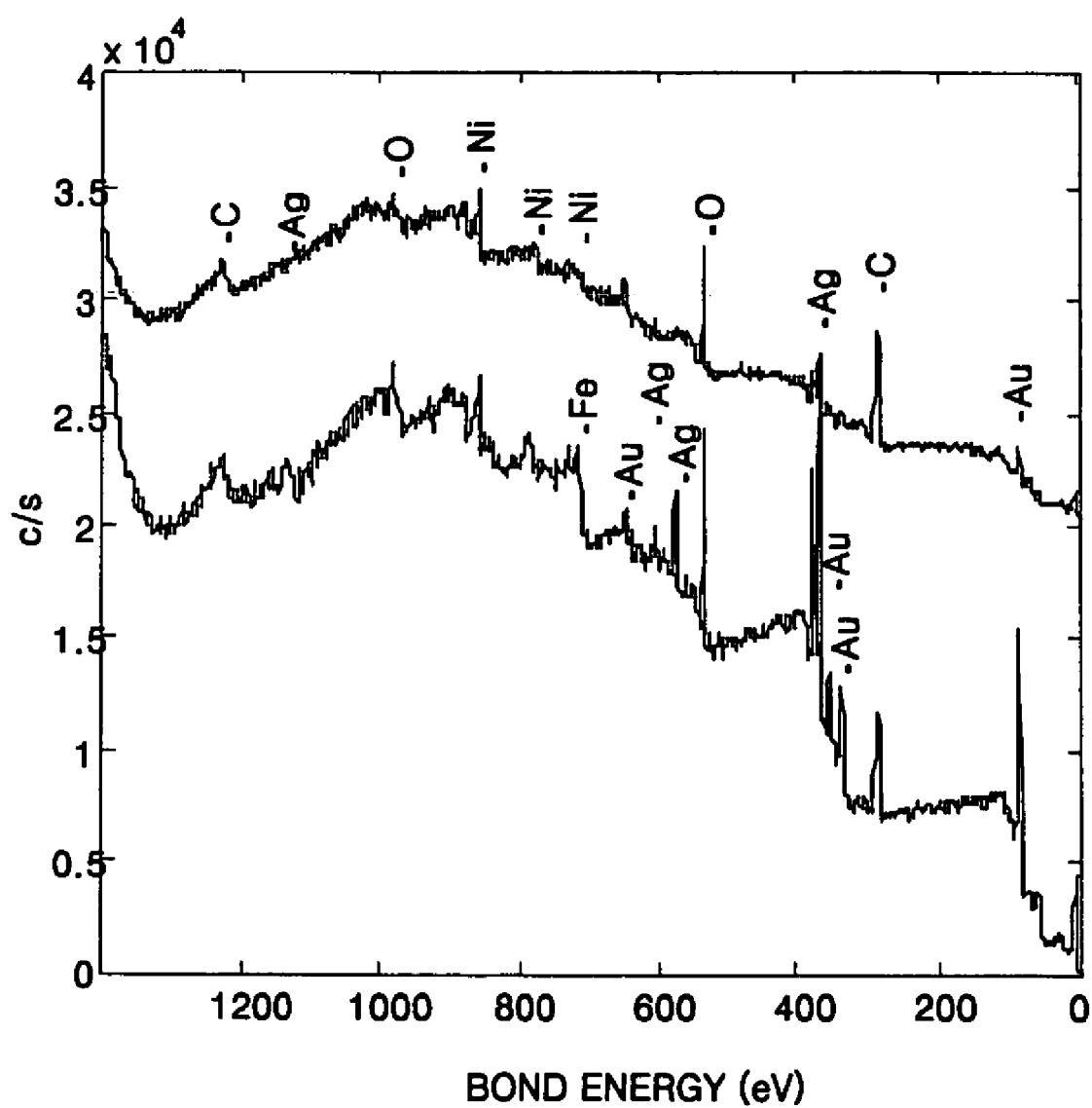
FIG. 8A is an XPS graph of the lead frame of FIG. 7A.

FIG. 7A shows a photograph of a semiconductor package 105 that has not been heat-treated and gone through the salt water spraying test as specified. This photograph shows that a lot of portions C of the leads 120 arranged about the semiconductor package 105 are corroded. Particularly, it shows that the corrosion is more sever at the bending portions B. When an XPS component of the semiconductor package 105 is analyzed, as shown in FIG. 8A, it can be noted that Ni and Fe are detected.

Figure 7B:
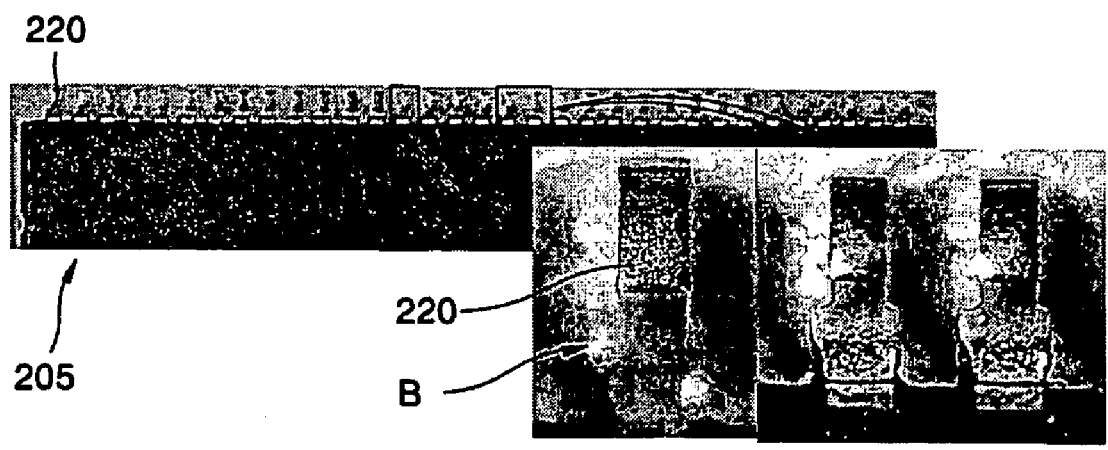
FIG. 7B is a photographic view of a lead frame that is manufactured according to the present invention and gone through a salt water spraying test.
Figure 8B:
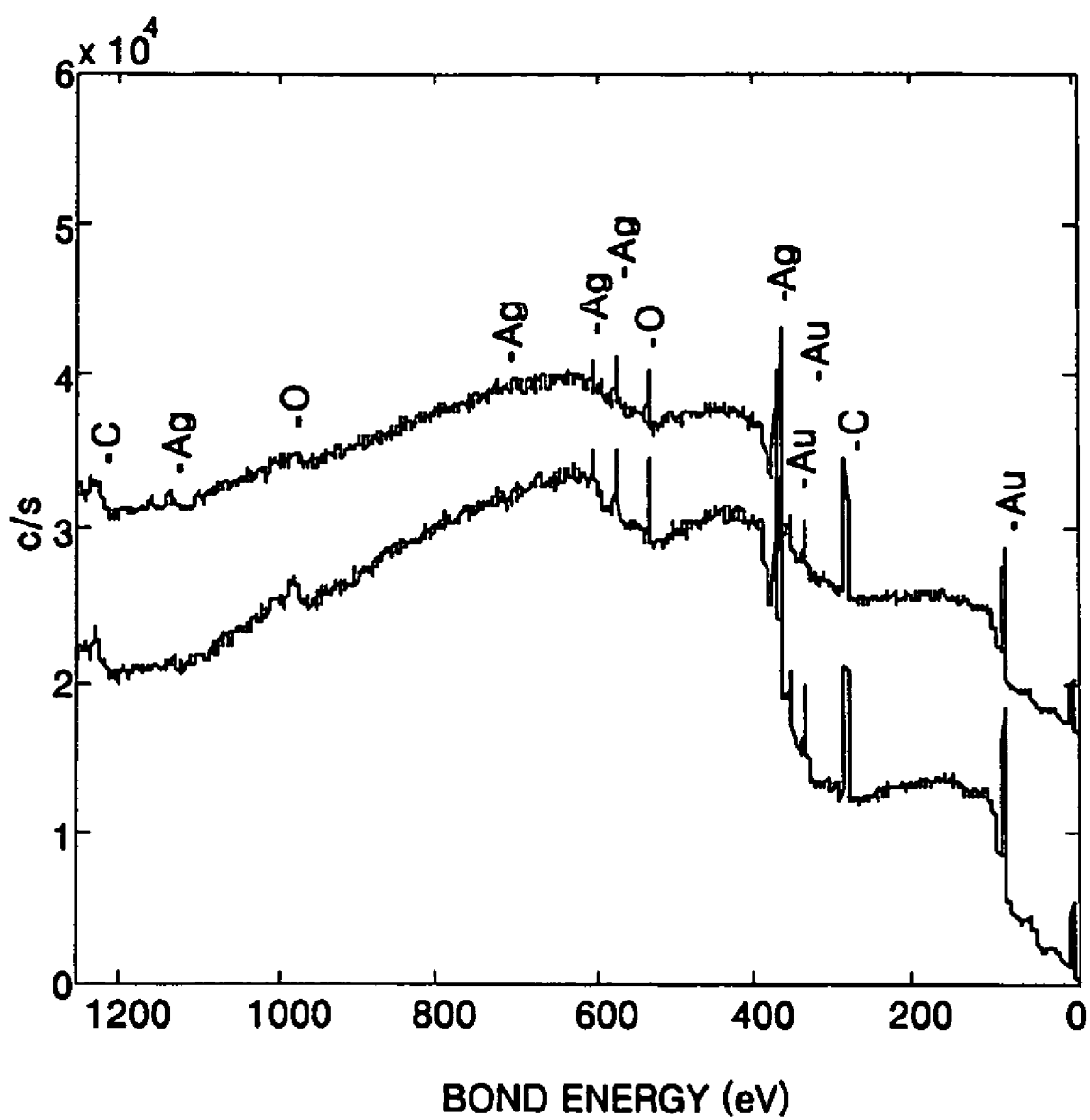
FIG. 8B is an XPS graph of the lead frame of FIG. 7B.

FIG. 7B, shows a photograph of a semiconductor package 205 that has been heat-treated according to the present invention and gone through the salt water spraying test as specified above. The photograph shows that no corroded portion is appeared at the leads 220 arranged about the semiconductor package 205. Particularly, there is no corroded portion even at the bending portions B. When an XPS component of the semiconductor package 205 is analyzed, as shown in FIG. 8B, it can be noted that Ni and Fe are not detected but only Au and Ag constituting the protective plating layer are detected.

Figure 9:
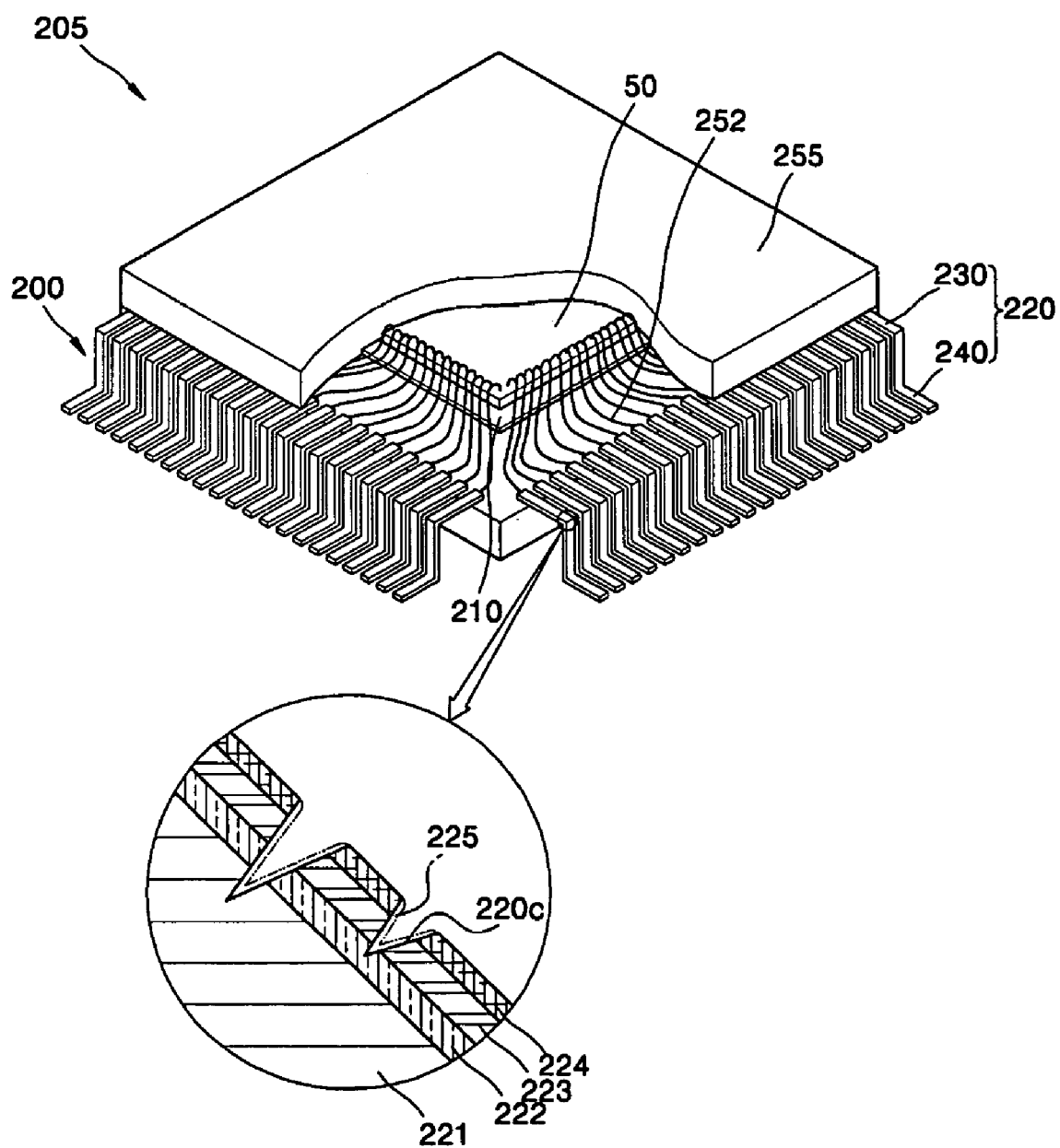
FIG. 9 is a perspective view of a semiconductor package with the lead frame manufactured according to the method as illustrated in FIG. 5.

FIG. 9 shows a lead frame 200 manufactured according to a method of the present invention and a semiconductor package 205 with the same.

Referring to FIG. 9, the lead frame 200 of the present invention includes the base metal layer 221, the Ni plating layer 222, the Pd plating layer 223, and the diffusing layer 225.

The base metal layer 221 is a bare frame of the lead frame 200, being formed preferably of nickel and iron as main elements. According to one preferred embodiment, the base metal layer 221 is formed of alloy 42.

The Ni plating layer 222 is deposited on the metal layer 221. The Ni plating layer 222 is formed of nickel or nickel alloy, preventing the alloy 42 or the Ni from being diffused to the surface of the lead frame.

The Pd plating layer 223 is deposited on the Ni plating layer 222, being formed of palladium or palladium alloy. The Pd plating layer 223 functions to enhance the soldering property.

The protective plating layer 224 may be deposited on the Pd plating layer 223. The protective plating layer 224 functions to prevent the surface of the Pd plating layer 223 from being oxidized. The protective plating layer 224 may be formed of at least one metal selected from the group consisting of Ag, Au, Co, Ti, and Pd.

The diffusion layer 225 is deposited on the external surface of the plated lead frame at least including the exposed portions 220c of the base metal layer 221, the Ni plating layer 22 and the Pd plating layer 223. That is, the exposed crack portions 220c, that can be readily developed near the bending portions B of the leads, the bonding portions W of the inner leads 230 bonded with a wire to the semiconductor chip, and the outer soldering portions S of the outer leads 240 bonded to the outer board, are covered by the diffusing layer 225, thereby preventing the exposed portions from exposing to the outer air.

In the step for forming the Pd plating layer 223 and the Ni plating layer 222, hydrogen may be absorbed in the lead frame, thereby deteriorating the density of the lead frame and making the plating layers unstable.

However in the present invention, as the heat treating step is performed, the hydrogen is activated by high temperature. As a result, the hydrogen atoms react one another, and are readily diffused and discharged to the external surface, thereby improving the corrosion-resistance property of the plating layers and also increasing the density, ductility and reliability of the plating layers and lead frame.

The minute cracks may be frequently developed, for example, at the bending portions B during the bending operation of the lead frame. However, in the present invention, by applying the diffusing layer to prevent the base metal layer 221, the Ni plating layer 222 and the Pd plating layer 223 from being exposed to the outer air, the corrosion of the lead frame at the bending portions B can effectively be prevented.

The diffusing layer 225 may be formed of at least one metal selected from the group consisting of Ag, Au, Co, Ti and Pd that are designed to form the diffusing layer by being heat-treated.

The semiconductor chip 50 is mounted on the lead frame 200 and electrically connected to an outer circuit, and thereby forms the semiconductor package 205. The semiconductor package 205 is generally comprised of the lead frame 200, the semiconductor chip 50, the wires 252, and the molding resin 255.

That is, the semiconductor chip 50 is disposed on the die pad 210 and the inner leads 230 are wire-bonded to the semiconductor chip 50 by the wires 252. The outer leads 240 are electrically connected to the outer circuit. The semiconductor chip 50 and the inner leads 230 are molded by the molding resin 255, and thereby form the semiconductor package 205.

FIG. 9 further shows an example of the semiconductor package with the inventive lead frame. However, the present invention is not limited to any particular structure of the semiconductor package such as the example as illustrated.

According to the present invention, since the heat treating operation is performed after the bending operation of the lead frame, the base metal layer, Ni plating layer and Pd plating layer are not exposed to the outer air. As a result, even when there are minute cracks developed, for example, during the bending operation of the lead frame, corrosion of the lead frame with the base metal layer (even where the base metal layer is formed of alloy 42) can effectively be prevented.

Furthermore, since a stress concentration phenomenon caused by the hydrogen components absorbed in the lead frame can be reduced through the heat-treating operation, the density, ductility and reliability of the lead frame can be further improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:

a lead frame including a base metal layer formed essentially of iron and nickel, at least one plating layer disposed on the base metal layer, the at least one plating layer including a protective plating layer formed of at least one metal selected from the group consisting of Ag, Au, Co, Ti, and Pd, the lead frame formed in shape and comprising externally exposed cracks;

a diffusion layer containing metallic components selected from the group consisting of Ag, Au, Co, Ti, and Pd, the diffusion layer being disposed by heat treating the at least one plating layer on the externally exposed cracks of the lead frame such that the diffusion layer protects the lead frame from corrosion developments at said externally exposed cracks;

a semiconductor chip mounted on the lead frame; and a molding material encapsulating the semiconductor chip.

2. The semiconductor device of claim 1, wherein the base metal layer is formed of Alloy 42.

3. The semiconductor device of claim 1, wherein the at least one plating layer comprises a Ni plating layer formed of nickel or nickel alloy and deposited on at least one surface of the base metal layer, and a Pd plating layer formed of palladium or palladium alloy and deposited on the Ni plating layer and below the protective plating layer.

4. A lead frame comprising:

a base metal layer formed of nickel and iron as major elements;

a Ni plating layer deposited on at least one surface of the base metal layer, the Ni plating layer being formed of nickel or nickel alloy;

a Pd plating layer deposited on the Ni plating layer, the Pd plating layer being formed of palladium or palladium alloy;

a protective plating layer disposed on the Pd plating layer, the protective layer being formed of at least one metal selected from the group consisting of Ag, Au, Co, Ti, and Pd; and a diffusion layer deposited on at least an exposed crack of the lead frame by heat treatment of the lead frame for protecting the lead frame from corrosion in the exposed crack, the diffusion layer containing at least one metal selected from the group consisting of Ag, Au, Co, Ti, and Pd.

5. The lead frame of claim 4, wherein the base metal layer is formed of Alloy 42.

6. The lead frame of claim 4, wherein the lead frame includes a bent portion, said bent portion comprising said at least an exposed crack, and the diffusion layer is deposited on said at least an exposed crack by said heat treatment of the lead frame after said lead frame is bent at the bent portion.

7. The lead frame of claim 4, wherein the lead frame includes at least one wire bonding portion or soldering portion, said at least one wire bonding portion or soldering portion comprising said at least an exposed crack, and the diffusion layer is deposited on said at least an exposed crack by said heat treatment of the lead frame.

8. The semiconductor device of claim 1, wherein the lead frame includes a bent portion and the bent portion includes said externally exposed cracks such that the diffusion layer protects the lead frame from corrosion developments at said exposed cracks in the bent portion.

9. The semiconductor device of claim 1, wherein the lead frame includes said externally exposed cracks developed at wire bonding portions or soldering portions of the lead frame such that the diffusion layer protects the lead frame from corrosion developments at said exposed cracks in the wire bonding portions or soldering portions of the lead frame.

* * * * *